US007355276B1

(12) United States Patent
Lanciault et al.

(10) Patent No.: US 7,355,276 B1
(45) Date of Patent: Apr. 8, 2008

(54) THERMALLY-ENHANCED CIRCUIT ASSEMBLY

(75) Inventors: Mark R. Lanciault, Foxborough, MA (US); Mark R. Dunbar, Princeton, MA (US); Stanislaw Dobosz, Shrewsbury, MA (US)

(73) Assignee: Maxtor Corporation, Scotts Valley, CA (US)

( * ) Notice: Subject to any disclaimer, the term of this patent is extended or adjusted under 35 U.S.C. 154(b) by 9 days.

(21) Appl. No.: 11/373,703

(22) Filed: Mar. 10, 2006

Related U.S. Application Data

(60) Provisional application No. 60/660,626, filed on Mar. 11, 2005, provisional application No. 60/660,627, filed on Mar. 11, 2005.

(51) Int. Cl.
*H01L 23/10* (2006.01)
*H01L 21/00* (2006.01)
(52) U.S. Cl. ............... 257/706; 257/717; 257/E23.101; 257/E21.511; 438/108; 438/122
(58) Field of Classification Search ............... 257/705, 257/706, 720, E23.101, 707, 717, E21.511; 438/119, 122, 125, 108, 118
See application file for complete search history.

(56) References Cited

U.S. PATENT DOCUMENTS

| 5,572,405 | A | * | 11/1996 | Wilson et al. | ............... | 361/705 |
| 5,751,063 | A | * | 5/1998 | Baba | ............... | 257/723 |
| 5,773,884 | A | * | 6/1998 | Andros et al. | ............... | 257/707 |
| 6,084,770 | A | * | 7/2000 | Wyland | ............... | 361/692 |
| 6,724,071 | B2 | * | 4/2004 | Combs | ............... | 257/666 |
| 6,756,668 | B2 | * | 6/2004 | Baek et al. | ............... | 257/704 |
| 2002/0079570 | A1 | * | 6/2002 | Ho et al. | ............... | 257/697 |
| 2003/0030139 | A1 | * | 2/2003 | Karnezos et al. | ............... | 257/712 |
| 2005/0084764 | A1 | * | 4/2005 | Lee et al. | ............... | 429/317 |
| 2005/0116335 | A1 | * | 6/2005 | Karim | ............... | 257/718 |
| 2006/0091530 | A1 | * | 5/2006 | Wang | ............... | 257/712 |
| 2007/0247855 | A1 | * | 10/2007 | Yano | ............... | 362/294 |

OTHER PUBLICATIONS

Guenin, Bruce M. et al., "Analysis of a Thermally Enhanced Ball Grid Array Package," IEEE Trans. on Components, Packaging, and Manufacturing Tech., Dec. 1995, pp. 749-757.
Guenin, Bruce M., "The Many Flavors of Ball Grid Array Packages," Electronics Cooling, Feb. 2002, pp. 32-40 (vol. 8, No. 1). Retrieved Mar. 1, 2006 from http://www.electronics-cooling.com/html/2002_february_a3.html.

* cited by examiner

*Primary Examiner*—T. N. Quach
(74) *Attorney, Agent, or Firm*—Derek J. Berger

(57) ABSTRACT

A circuit assembly for mounting one or more integrated circuits that effectively dissipates heat generated by the integrated circuits, and a corresponding method for fabricating such a circuit assembly. The circuit assembly comprises a substrate, a thermally-conductive adhesive layer and a heat-dissipating layer. The substrate includes an opening extending between a first surface and a second surface of the substrate. An integrated circuit is to be mounted on the first surface of the substrate substantially coincident with the opening. The thermally-conductive adhesive layer is at least partially disposed within the opening in the substrate. The heat-dissipating layer is disposed on the second surface of the substrate and includes a raised portion that at least partially extends through the opening in the substrate.

20 Claims, 2 Drawing Sheets

US 7,355,276 B1

THERMALLY-ENHANCED CIRCUIT ASSEMBLY

CROSS-REFERENCE TO RELATED APPLICATIONS

The present application claims priority from U.S. Provisional Patent Application Ser. No. 60/660,626 filed on Mar. 11, 2005 entitled "THERMAL ENHANCEMENT OF FLIP-CHIP ON FLEX VIA FLEX CUTOUT, HIGH THERMAL CONDUCTIVITY UNDERFILL EPOXY AND RAISED METAL THROUGH CUTOUT" and from U.S. Provisional Patent Application Ser. No. 60/660,627 filed on Mar. 11, 2005 entitled "THERMAL ENHANCEMENT OF FLIP-CHIP ON FLEX VIA FLEX CUTOUT AND HIGH THERMAL CONDUCTIVITY UNDERFILL EPOXY," the entirety of which are incorporated herein by reference.

BACKGROUND OF THE INVENTION

The present invention relates generally to integrated circuit assemblies and more specifically to thermal management for integrated circuit assemblies.

Integrated circuit die directly mounted on flexible substrates are referred to as flip-chip-on-flex (FCOF) (or flexible circuit) assemblies. FIG. 1 shows a simplified cut-away drawing of an example of a conventional FCOF assembly 100. The FCOF assembly 100 includes a flexible substrate 110 on which is mounted a flip-chip die 101. Multiple die pads 115 are disposed on a surface of the die 101 facing the substrate 110 (Note: FIG. 1 shows only two of the die pads, in cross-sectional view).

The flexible substrate 110 is composed of polymer film layers 111(a) and 111(b) bonded to a metal trace layer 112 with adhesive layers 113(a) and 113(b), respectively. The flexible substrate 110 includes multiple conductive pads 116 that are formed where the metal trace layer 112 is exposed through the polymer film layer 111(a) and the adhesive layer 113(a) (Note: FIG. 1 shows only two of the conductive pads, in cross-sectional view). The multiple conductive pads 116 are positioned such that they coincide with the multiple die pads 115 when the die 101 is mounted on the substrate 110. Multiple solder bumps 119 are used to bond and electrically connect the corresponding die pads 115 and conductive pads 116.

An adhesive underfill layer 118, typically made of an epoxy material, fills the space between the die 101 and the flexible substrate 110. The underfill layer 118 is used to support the die 101 mechanically while controlling the stresses that may develop in the solder bumps 119.

A stiffener 125 is bonded to a surface of the flexible substrate 110 opposite that of the die 101 using an adhesive layer 113(c). The stiffener 125, typically composed an aluminum sheet, is primarily used to stiffen the flexible substrate 110 so that it provides a planar surface for mounting the die 101.

Conventional thermal management techniques for FCOF and other types of circuit assemblies such as the use of heat sinks are becoming increasingly inadequate due to several factors. First, integrated circuits are being operated at increasingly high frequencies, thereby generating more heat. At the same time, integrated circuits and circuit assemblies are increasing in density, causing the heat to be concentrated in a smaller area. As a result, the temperature of integrated circuits in these assemblies is increasing to the point of adversely affecting their reliability.

Accordingly, there is a need for a more effective way to dissipate heat generated by integrated circuits in FCOF and other types of circuit assemblies.

BRIEF SUMMARY OF THE INVENTION

The present invention is directed to a circuit assembly for mounting one or more integrated circuits that provides effective heat dissipation, and a corresponding method for fabricating such a circuit assembly. The circuit assembly of the invention comprises a substrate, a thermally-conductive adhesive layer and a heat-dissipating layer. The substrate includes an opening extending between a first surface and a second surface of the substrate. An integrated circuit is to be mounted on the first surface of the substrate substantially coincident with the opening. The thermally-conductive adhesive layer is at least partially disposed within the opening in the substrate. The heat-dissipating layer is disposed on the second surface of the substrate and includes a raised portion that at least partially extends through the opening in the substrate.

The method of the present invention comprises the steps of: (1) providing a substrate including an opening extending between a first surface and a second surface of the substrate; (2) providing a heat-dissipating layer including a raised portion; (3) placing the heat-dissipating layer on the first surface of the substrate such that the raised portion at least partially extends through the opening in the substrate; (4) depositing a thermally-conductive adhesive material into the opening in the substrate; and (5) placing the integrated circuit on the second surface of the substrate substantially coincident with the opening in the substrate.

This invention provides a heat conduction path from the integrated circuit(s) to the heat-dissipating layer having a relatively low thermal resistance. Consequently, it provides an effective means for dissipating the heat generated by the integrated circuit(s) in the circuit assembly.

The present invention provides a relatively simple and effective technique for dissipating the heat generated by integrated circuits in circuit assemblies. It allows circuit assemblies to use integrated circuits with higher power dissipation and/or smaller size without affecting device performance or reliability. Additional advantages of the present invention will become readily apparent from the following discussion, particularly when taken together with the accompanying drawings.

DETAILED DESCRIPTION OF THE INVENTION

The detailed description set forth below in connection with the appended drawings is intended as a description of various embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details.

Figure 1:
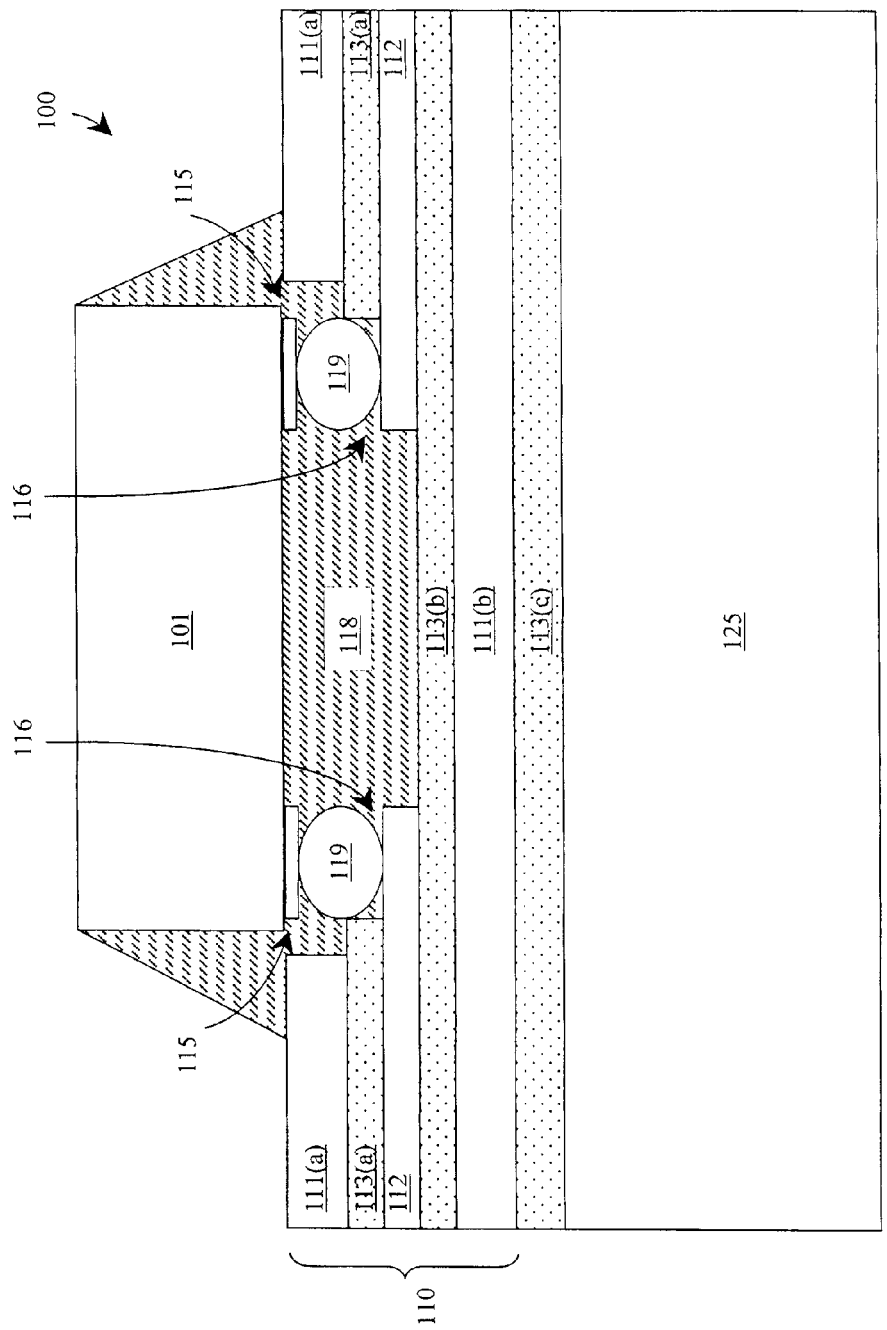
FIG. 1 is a simplified cross-sectional view of a conventional FCOF assembly.
Figure 2:
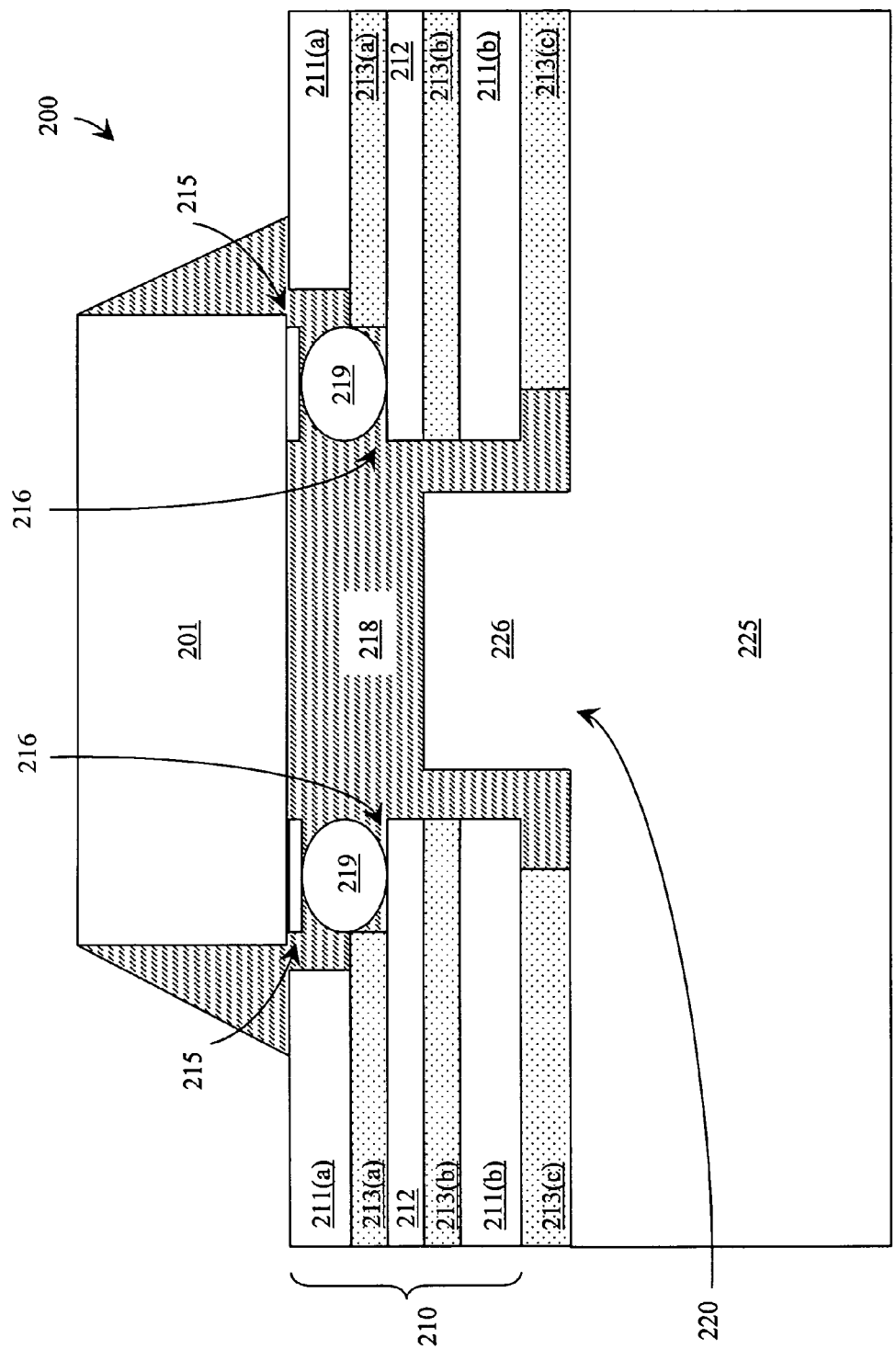
FIG. 2 is a simplified cross-sectional view of an FCOF assembly in accordance with an embodiment of the present invention.

FIG. 2 shows a simplified cut-away view of an FCOF assembly 200 in accordance with an embodiment of the present invention. The following discussion will focus on the aspects of the FCOF assembly 200 specific to the present invention.

The FCOF assembly 200 includes a flexible substrate 210 for mounting a die 201. The flexible substrate 210 includes polyimide layers 211(a) and 211(b), a copper trace layer 212 and adhesive layers 213(a) and 213(b). The polyimide layers 211(a) and 211(b) are preferably made of Kapton®, available from DuPont High Performance Materials, Circleville, Ohio. The flexible substrate 210 is not a very effective heat conductor since the polyimide layers 211(a) and 211(b) have relatively low thermal conductivities.

The flexible substrate 210 includes multiple conductive pads 216 that are formed where the copper trace layer 212 is exposed through the polyimide layer 211(a) and the adhesive layer 213(a) (Note: FIG. 2 shows only two of the conductive pads, in cross-sectional view). The multiple conductive pads 216 are positioned such that they coincide with the multiple die pads 215 of the mounted die 201. Multiple solder bumps 219 are used to bond and electrically connect the corresponding die pads 215 and conductive pads 216.

The die 201 is mounted over an opening 220 in the flexible substrate 210 disposed interior to the multiple conductive pads 216. The opening 220 passes completely through all of the layers of the flexible substrate 210.

To minimize the thermal resistance of a heat conduction path (described below), it is preferable that the opening 220 be made as large as possible. However, the size of the opening 220 is typically limited by the dimensions of the die 201. To at least partially circumvent this limitation, the opening 220 can be made larger at an end facing away from the die 201, as shown in FIG. 2.

A thermally-conductive adhesive layer 218, used as an underfill for the die 201, is disposed within the opening 220. The thermally-conductive adhesive layer 218 is made of an adhesive material with a thermal conductivity significantly higher than that of conventional underfill materials. The thermal conductivity of the thermally-conductive adhesive layer 218 is preferably greater than approximately 0.6 W/m·K or even more preferably, greater than approximately 1.0 W/m·K. The thermally-conductive adhesive layer 218 is preferably composed of an epoxy material. In the present embodiment, the thermally-conductive adhesive layer 218 is made of the thermal interface material (underfill grade) XS8449-3E, available from NAMICS Corp., Niigata-City, Japan. This material has a thermal conductivity of approximately 1.2 W/m·K.

A heat spreader 225 is bonded to a surface of the flexible substrate 210 opposite the die 201 with an adhesive layer 213(c). The heat spreader 225 includes a raised portion 226 that projects at least partially through the opening 220. The heat spreader 225 helps to dissipate the heat generated by the die 201 as well as stiffen the flexible substrate 210. The heat spreader 225 is made of a material with a high thermal conductivity, preferably an aluminum alloy or copper.

A heat conduction path from the die 201 to the heat spreader 225 having a relatively low thermal resistance is formed through the thermally-conductive adhesive layer 218 disposed within the opening 220. The raised portion 226 of the heat spreader 225 shortens the effective length of the heat conduction path to further reduce the path's thermal resistance.

An alternative heat management technique to the present invention uses "thermal vias" to conduct heat away from the die. In this technique, the openings in the substrate are filled with a solder metal rather than the adhesive material of the thermally-conductive adhesive layer 218. However, the maximum size of opening supported by the thermal via technique is substantially smaller than that of the present invention due to the different hole-filling abilities of the solder metal and the adhesive material.

While the present invention has been described with reference to a specific embodiment, the description is illustrative of the invention and is not to be construed as limiting the invention. Various modifications may occur to those skilled in the art without departing from the true spirit and scope of the invention as defined by the appended claims.

What is claimed is:

1. A circuit assembly for mounting an integrated circuit, comprising:
    a substrate including an opening extending between a first surface and a second surface of the substrate, wherein the integrated circuit is to be mounted on the first surface substantially coincident with the opening;
    a thermally-conductive adhesive layer at least partially disposed within the opening in the substrate; and
    a heat-dissipating layer disposed on the second surface of the substrate and including a raised portion that at least partially extends through the opening in the substrate.

2. The circuit assembly of claim 1, wherein:
    the integrated circuit comprises a die; and
    the substrate comprises a flexible circuit substrate.

3. The circuit assembly of claim 1, wherein a cross-sectional area of the opening at the first surface of the substrate differs from a cross-sectional area of the opening at the second surface of the substrate.

4. The circuit assembly of claim 1, wherein the thermally-conductive adhesive layer is composed of a material having a thermal conductivity of approximately 0.6 W/m·K or greater.

5. The circuit assembly of claim 1, wherein the thermally-conductive adhesive layer is composed of a material having a thermal conductivity of approximately 1.0 W/m·K or greater.

6. The circuit assembly of claim 1, wherein the thermally-conductive adhesive layer is at least partially composed of an underfill material.

7. The circuit assembly of claim 1, wherein the heat-dissipating layer is at least partially composed of a metallic material.

8. A circuit assembly, comprising:
    a flexible substrate including an opening extending between a first surface and a second surface of the substrate;
    an integrated circuit die disposed on the first surface of the substrate substantially coincident with the opening in the substrate;
    a thermally-conductive adhesive layer at least partially disposed within the opening in the substrate; and
    a heat-dissipating layer disposed on the second surface of the substrate and including a raised portion that at least partially extends through the opening in the substrate.

9. The circuit assembly of claim 8, wherein a cross-sectional area of the opening at the first surface of the substrate differs from a cross-sectional area of the opening at the second surface of the substrate.

10. The circuit assembly of claim 8, wherein the thermally-conductive adhesive layer is composed of a material having a thermal conductivity of approximately 0.6 W/m·K or greater.

11. The circuit assembly of claim 8, wherein the thermally-conductive adhesive layer is composed of a material having a thermal conductivity of approximately 1.0 W/m·K or greater.

12. The circuit assembly of claim 8, wherein the thermally-conductive adhesive layer is at least partially composed of an underfill material.

13. The circuit assembly of claim 8, wherein the heat-dissipating layer is at least partially composed of a metallic material.

14. A method of fabricating a circuit assembly, comprising the steps of:
   providing a substrate including an opening extending between a first surface and a second surface of the substrate;
   providing a heat-dissipating layer including a raised portion;
   placing the heat-dissipating layer on the first surface of the substrate such that the raised portion at least partially extends through the opening in the substrate;
   depositing a thermally-conductive adhesive material into the opening in the substrate; and
   placing an integrated circuit on the second surface of the substrate substantially coincident with the opening in the substrate.

15. The method of claim 14, wherein:
   the substrate comprises a flexible circuit substrate; and
   the integrated circuit comprises a die.

16. The method of claim 14, wherein a cross-sectional area of the opening at the first surface of the substrate differs from a cross-sectional area of the opening at the second surface of the substrate.

17. The method of claim 14, wherein the heat-dissipating layer is at least partially composed of a metallic material.

18. The method of claim 14, wherein the thermally-conductive adhesive material has a thermal conductivity of approximately 0.6 W/m·K or greater.

19. The method of claim 14, wherein the thermally-conductive adhesive material has a thermal conductivity of approximately 1.0 W/m·K or greater.

20. The method of claim 14, wherein the thermally-conductive adhesive material is at least partially an underfill material.

* * * * *